United States Patent
Hugo et al.

(10) Patent No.: US 9,427,828 B2
(45) Date of Patent: Aug. 30, 2016

(54) INCREASING SOLDER HOLE-FILL IN A PRINTED CIRCUIT BOARD ASSEMBLY

(71) Applicant: International Business Machines Corporation, Armonk, NY (US)

(72) Inventors: Stephen M. Hugo, Rochester, MN (US); Matthew S. Kelly, Ontario (CA)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 49 days.

(21) Appl. No.: 14/454,839

(22) Filed: Aug. 8, 2014

(65) Prior Publication Data
US 2016/0044791 A1 Feb. 11, 2016

(51) Int. Cl.
| | | |
|---|---|---|
| *B23K 1/00* | (2006.01) | |
| *B23K 1/20* | (2006.01) | |
| *H05K 7/20* | (2006.01) | |
| *B23K 31/02* | (2006.01) | |
| *B23K 31/12* | (2006.01) | |
| *H05K 3/34* | (2006.01) | |

(52) U.S. Cl.
CPC ............. *B23K 31/02* (2013.01); *B23K 1/0016* (2013.01); *B23K 31/12* (2013.01); *H05K 3/3447* (2013.01); *H05K 3/3468* (2013.01); *H05K 2203/044* (2013.01); *H05K 2203/1509* (2013.01); *H05K 2203/306* (2013.01)

(58) Field of Classification Search
CPC .. B23K 1/085; B23K 3/0653; H05K 3/3447; H05K 1/0272; H05K 1/116; H05K 3/429
USPC ...... 228/102, 173.1, 256, 33, 37, 7; 257/774
See application file for complete search history.

(56) References Cited

U.S. PATENT DOCUMENTS

| | | | |
|---|---|---|---|
| 3,893,409 A | 7/1975 | Rote | |
| 4,602,730 A | 7/1986 | Murakami et al. | |
| 5,361,964 A | 11/1994 | Sim | |
| 5,762,257 A | 6/1998 | Garrecht | |
| 7,918,383 B2 | 4/2011 | Kirby et al. | |
| 2004/0137803 A1* | 7/2004 | Pitzele | H01R 9/091 439/884 |
| 2012/0234902 A1 | 9/2012 | Chey et al. | |
| 2012/0289042 A1 | 11/2012 | Lee | |

FOREIGN PATENT DOCUMENTS

CN 203124889 U 8/2013

OTHER PUBLICATIONS

Appendix P, 2016.

* cited by examiner

*Primary Examiner* — Erin Saad
(74) *Attorney, Agent, or Firm* — Garg Law Firm, PLLC; Rakesh Garg; Damion Josephs

(57) ABSTRACT

A method, apparatus, and computer program product for increasing solder hole-fill in a printed circuit board assembly (PCBA) are provided in the illustrative embodiments. In the PCBA comprising a Printed Circuit Board (PCB) and the device, a pin of a device is caused to move in a first direction, the pin occupying a hole in the PCB, the hole being filled to a first distance by a solder material. By causing the pin to move, the solder material is drawn into the hole up to a second distance that is greater than the first distance. The pin is allowed to move in a second direction, to return the pin to an initial position in the hole. Allowing the pin to move in the second direction keeps the solder material at a third distance, wherein the third distance is greater than the first distance in the hole.

15 Claims, 4 Drawing Sheets

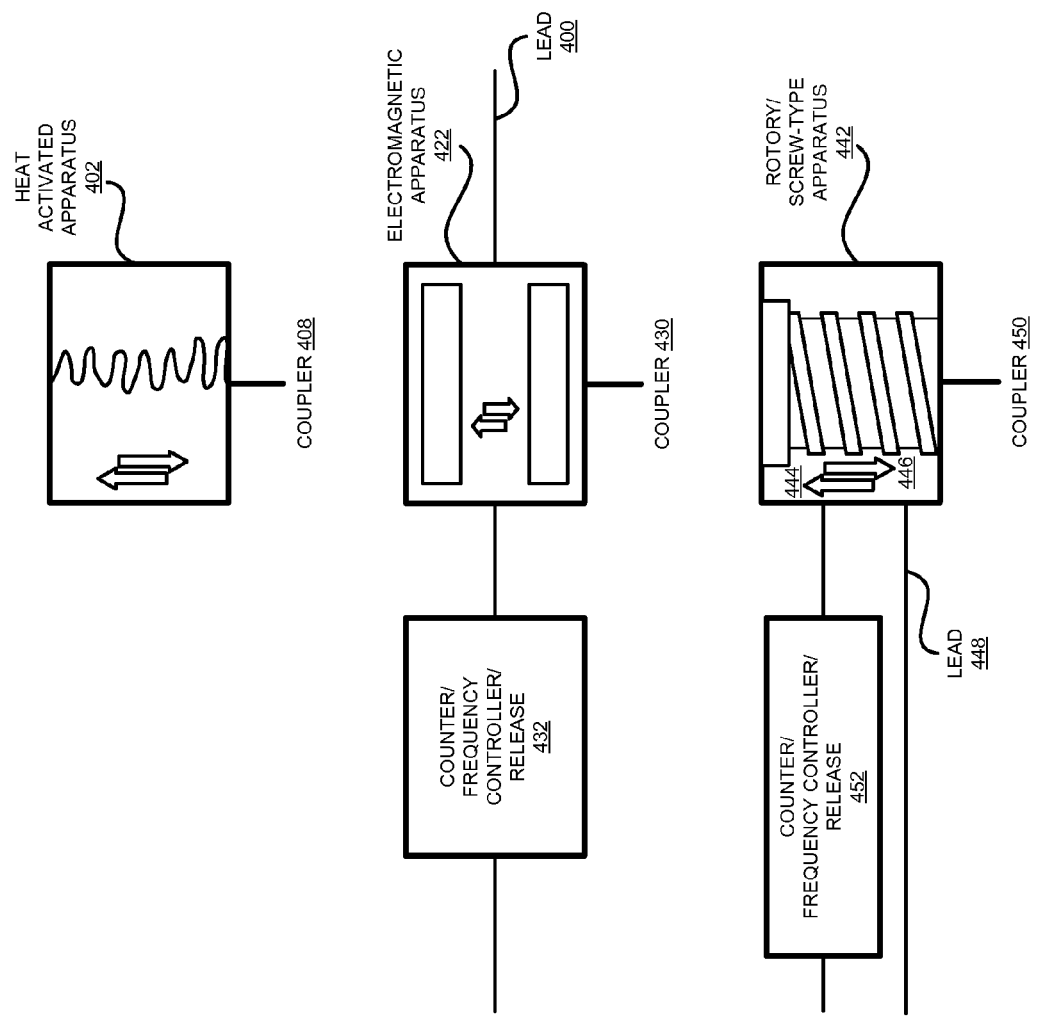

INCREASING SOLDER HOLE-FILL IN A PRINTED CIRCUIT BOARD ASSEMBLY

TECHNICAL FIELD

The present invention relates generally to a method, system or apparatus, and computer program product for manufacturing printed circuit board assemblies. More particularly, the present invention relates to a method, system or apparatus, and computer program product for increasing solder hole-fill in a printed circuit board assembly.

BACKGROUND

A Printed Circuit Board (PCB, plural PCBs) is a platform on which electronic components or devices, such as resistors, capacitors, integrated circuit packages, transistors, thyristors, transducers, switches, and many other types of electronic and electrical components, (collectively referred to hereinafter as "device" or "devices") are rested, arranged, and electrically connected to one another as one or more circuits. A PCB with one or more devices configured thereon is called a Printed Circuit Board Assembly (PCBA, plural PCBAs).

PCBAs are common-place, and are found in almost anything that includes some electronic parts. In the simplest form, a PCB originates as a thin flat board with one side coated in a conductive material, typically copper. The devices participating in a circuit occupy one side of an example single-sided PCB.

A circuit design is overlaid on the board to identify the locations of the various devices that will participate in a circuit that will be formed using the board. The positions of the devices identify the positions of the connectors, leads, or terminals (collectively referred to hereinafter as "pin" or "pins) of the devices, e.g., the positions of connector pins of an integrated circuit, the positions of the leads of a resistor or capacitor, the terminals of a transistor, and the like. The conductive paths of the circuit connecting those pins are marked and masked on the conductive coating of the PCB.

The conductive coating is then etched, typically by using a chemical process, which removes all conductive material except the masked areas of the conductive material. The positions of the pins are drilled as holes through the board either prior to the etching or after the etching.

A pin partially or fully passes through a conductive material plated hole, e.g., a Copper plated hole, such that the pin becomes accessible from the side of the board opposite the side where the device is positioned. The pin is soldered to a conductive path that remains on the PCB after etching. This conductive path typically comprises a drilled hole that is plated with a conductive material, such as, including but not limited to Copper. This plating that is attached to the inner wall of the cylindrical hole will form a connection to inner conductive layers and conductive circuit traces that are exposed inside the hole by the drilling process. Further, this conductive structure is also connected to conductive pads that are on the top and bottom side of the hole. These pads are connected during the plating process.

The solder material is conductive material, e.g., a tin-lead alloy or silver, which is heated to a liquid state. The solder material often includes a flux material that removes any oxidation of the conductive material or other debris in the holes that might prevent the solder material from forming an acceptable electrically conducting path between the pin and the conductive path.

During the PCBA assembly process, the liquid solder material, and any flux material mixed therein, fills the conductively plated holes occupied by pins. The solder material solidifies in the holes, forming electrical connections between the pins in the holes and their respective conducting paths reaching or passing through the hole positions.

A variety of soldering techniques are used to solder the pins in the holes. Wave soldering is one example technique that causes a wave of solder material to rise on a side opposite the side where a device is positioned, and into one or more conductively plated holes occupied by a pin of the device. The solder material that rises into the holes solidifies in those holes forming electrical connections between the corresponding pins and conductive paths. The wave can rise into one or more holes occupied by a corresponding number of pins of one or more devices at a time.

Double-sides and multi-layered PCBs are used in a similar manner. For example, in a double-sides PCB, devices can be positioned on both sides of the PCB, conductive paths of the different or same circuits can be etched on both sides of the PCB, and solder can be applied from both sides for connecting the devices on the opposite sides with their respective circuits. Any number of single-sides or double-sides PCBs can be stacked to form multi-layered PCBs in a similar manner.

SUMMARY

The illustrative embodiments provide a method, system or apparatus, and computer program product for increasing solder hole-fill in a printed circuit board assembly. An embodiment includes a method for increasing solder hole-fill in a Printed Circuit Board Assembly (PCBA). The embodiment causes, in the PCBA, a pin of a device to move in a first direction, the PCBA comprising a Printed Circuit Board (PCB) and the device, the pin occupying a hole in the PCB, the hole being filled to a first distance by a solder material. The embodiment draws, responsive to causing the pin to move, the solder material into the hole up to a second distance, wherein the second distance is greater than the first distance. The embodiment allows the pin to move in a second direction, wherein the move in the second direction returns the pin to an initial position in the hole, and wherein the allowing the pin to move in the second direction keeps the solder material at a third distance, wherein the third distance is greater than the first distance in the hole.

Another embodiment includes a computer usable program product comprising a computer readable storage device including computer usable code for increasing solder hole-fill in a Printed Circuit Board Assembly (PCBA). The embodiment further includes computer usable code for causing, in the PCBA, a pin of a device to move in a first direction, the PCBA comprising a Printed Circuit Board (PCB) and the device, the pin occupying a hole in the PCB, the hole being filled to a first distance by a solder material, the causing the pin to move resulting in drawing the solder material into the hole up to a second distance, wherein the second distance is greater than the first distance. The embodiment further includes computer usable code for allowing the pin to move in a second direction, wherein the move in the second direction returns the pin to an initial position in the hole, and wherein the allowing the pin to move in the second direction keeps the solder material at a third distance, wherein the third distance is greater than the first distance in the hole.

Another embodiment includes an apparatus for increasing solder hole-fill in a Printed Circuit Board Assembly (PCBA). The embodiment further includes a first hardware component for causing, in the PCBA, a pin of a device to move in a first direction, the PCBA comprising a Printed Circuit Board (PCB) and the device, the pin occupying a hole in the PCB, the hole being filled to a first distance by a solder material, the causing the pin to move resulting in drawing the solder material into the hole up to a second distance, wherein the second distance is greater than the first distance. The embodiment further includes a second hardware component for allowing the pin to move in a second direction, wherein the move in the second direction returns the pin to an initial position in the hole, and wherein the allowing the pin to move in the second direction keeps the solder material at a third distance, wherein the third distance is greater than the first distance in the hole.

BRIEF DESCRIPTION OF THE SEVERAL VIEWS OF THE DRAWINGS

The novel features believed characteristic of the invention are set forth in the appended claims. The invention itself, however, as well as a preferred mode of use, further objectives and advantages thereof, will best be understood by reference to the following detailed description of the illustrative embodiments when read in conjunction with the accompanying drawings, wherein:

FIG. 4 depicts block diagrams of several example apparatus configurations any of which can be used for increasing solder hole-fill in a printed circuit board assembly in accordance with an illustrative embodiment.

DETAILED DESCRIPTION

Figure 1:
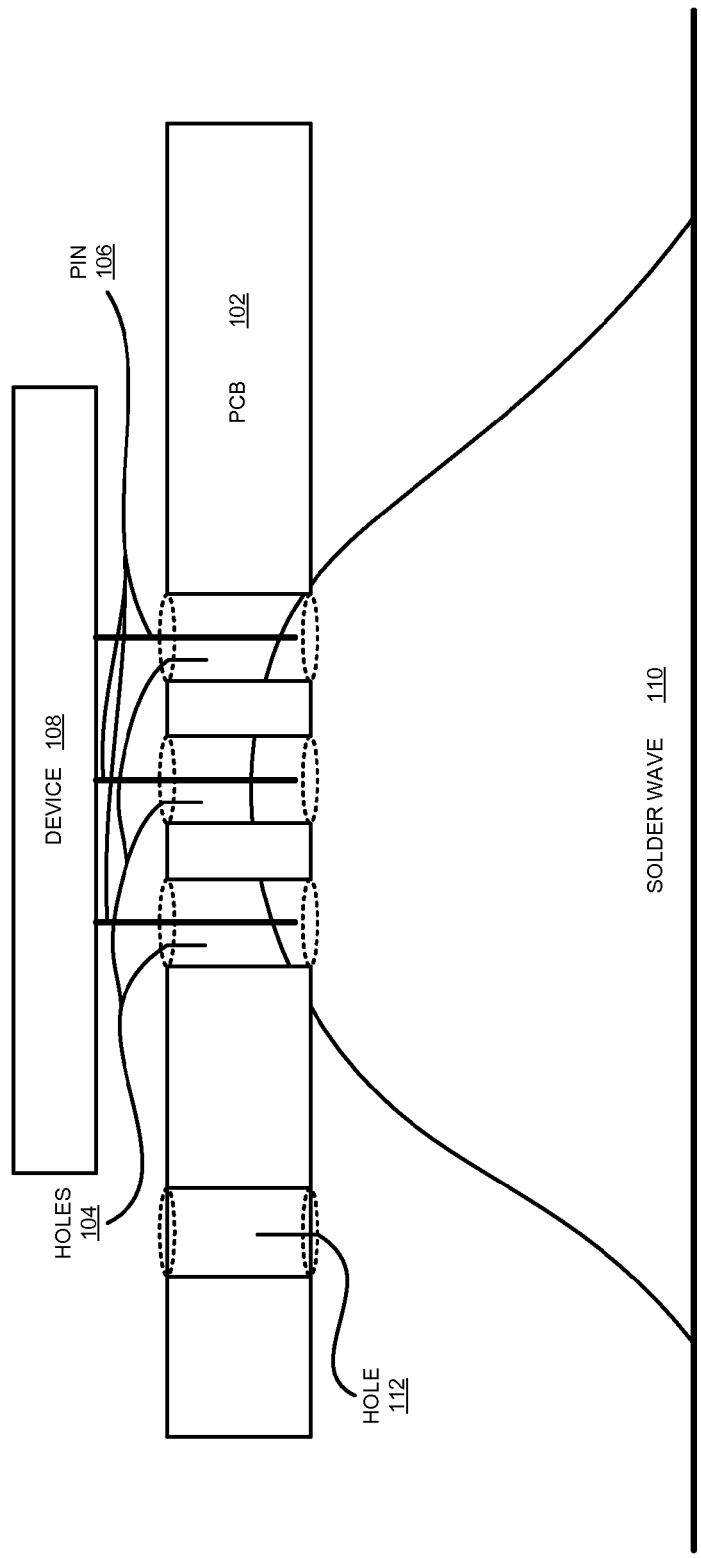
FIG. 1 depicts a block diagram of a network of data processing systems in which illustrative embodiments may be implemented.

The illustrative embodiments are described using single-sided PCBs and PCBAs only as examples and not to imply any limitation on the illustrative embodiments. An embodiment described herein can be adapted for use with double-sided or multi-layered PCBs and PCBAs in a similar manner, and the same are contemplated within the scope of the illustrative embodiments. The illustrative embodiments are described using copper and certain solder materials only as examples and not to imply any limitation on the illustrative embodiments. An embodiment described herein can be adapted for use with other conductive materials and other solder materials in a similar manner, and the same are contemplated within the scope of the illustrative embodiments.

The illustrative embodiments recognize that during the soldering process in a PCBA assembly process, the solder material often does not fill the holes in the PCB to a satisfactory level. For example, if the hole is expected to be filled fully (hundred percent height threshold) such that soldering material reaches each opposite ends of the hole, the presently used soldering processes fail to achieve such solder material reach. As another example, if the hole is expected to be filled to a certain height beginning from the side the solder material is applied (a height threshold), often, the presently used soldering processes fail to achieve such solder material height into the hole. The height threshold can be specified in percentage, ratio, relative height, absolute height, or in any other suitable manner within the scope of the illustrative embodiments.

The illustrative embodiments recognize that several factors are responsible for the solder material's failure to achieve a given height threshold for the holes in a PCB. For example, in some cases, the holes are plated with copper and are often connected to several ground or power planes, which are also made of copper. These plating, grounding, power planes, and other structures are also thermally conducting, and therefore add thermal mass to the PCB. Molten solder material has to remain in the molten state and flow for a period to reach a height threshold in a hole. However, this added thermal mass causes the solder material to dissipate heat and solidify before reaching the height threshold.

One method to overcome this additional heat dissipation due to the additional thermal mass is to increase the thermal energy of the molten solder material. However, the illustrative embodiments recognize that this raises the temperature of the solder material, which can often have undesirable effects on the devices in the PCBA, the PCB material, or both.

Another factor responsible for the solder material's failure to achieve a given height threshold for the holes in a PCB is the oxidation of copper used on the PCB. Oxidation prevents the solder material from adequately wetting to the copper or other conductive material. The lack of adequate wetting impedes the flow of thermal energy to the copper structure, thereby reducing flow of molten solder material. As the solder material flows progressively farther into the hole, the solder material encounters lower temperature copper that remains oxidized in the hole. This lower temperature oxidized copper prematurely cools the solder material to a state where the flow of the solder material is impeded.

Another current solution used to address the oxidized copper problem is to reduce the amount of power and ground planes connected to the hole, and to change the plane connection structure geometry. The illustrative embodiments recognize that although this technique reduces the thermal mass somewhat, the reduction is not always sufficient to achieve the height threshold, e.g., the minimum fifty percent hole-fill as required by certain industry specifications.

An additional presently-used method is to use more aggressive solder flux chemicals. However, the illustrative embodiments recognize that when no-clean fluxes are not adequate for this purpose, water soluble fluxes have to be used, and such fluxes are often not compatible with other solder chemistries on the PCBA.

The illustrative embodiments used to describe the invention generally address and solve the above-described problems and other problems related to solder material failing to reach a given height in PCB holes during PCBA assembly process. The illustrative embodiments provide a method, system or apparatus, and computer program product for increasing solder hole-fill in a printed circuit board assembly.

An embodiment causes a pin to move in a hole that is being filled with solder material. Particularly, the embodiment causes the pin to move in the hole to draw the solder material into the hole.

For example, assume that a PCB has a device occupying a side—the device side (e.g., a top side), has one or more holes drilled through the PCB, has one or more pins protruding from the device into the one or more corresponding holes, and has solder material being applied to the one or more holes from an opposite side—the solder side (e.g., a bottom side). The flow of the solder material in the hole is therefore from the solder side to the device side.

For a hole occupied by a pin, an embodiment causes the pin in the hole to move in the direction of the flow of the solder material and then in the opposite direction of the flow, while the molten solder is flowing into the hole. In other words, while the solder material is flowing into the hole, the embodiment causes the pin to move away from the solder in the hole for a certain amount of time or distance, then reverse the direction of the movement of the pin in the hole and cause the pin to move towards the solder material. Thus, the embodiment causes a reciprocating movement of the pin along the longitudinal axis of the hole.

In some cases, the movement in the direction of the flow causes a mild vacuum to be created in the hole, drawing the solder farther into the hole as compared to when the solder flows without the pin movement. In some other cases, the molten solder has adhered to a portion of the pin prior to the movement in the direction of the flow. The movement in the direction of the flow causes the molten solder material to move with the pin in the direction of the movement due to adhesion, drawing the molten solder farther into the hole as compared to when the solder flows without the pin movement. In some cases, the movement in the direction of the flow causes both the vacuum and the adhesion, drawing the molten solder farther into the hole as compared to when the solder flows without the pin movement.

An embodiment repeats the reciprocating movement of the pin a number of times. For example, assume that a wave of solder material lasts 10 second. One embodiment causes the reciprocating movement of the pin to occur 1-to-4 times in the 10 second duration. Thus, the movement of the pin in the hole according to the illustrative embodiments is distinct from vibrating the pin at least because the frequency of the reciprocating movement is significantly less than typical vibrating frequencies which are typically in the range of tens to hundreds or thousands of times per second, to wit, of higher order than the duration of the wave, e.g., of exponential order. Generally, the order of the frequency of the reciprocating movement according to the illustrative embodiments is of the order of the duration of the wave or less. Furthermore, most vibrations are side to side in contrast with the directions of reciprocating movement described herein.

An embodiment can be configured to use any suitable mechanism to cause the pin to reciprocate relative to the hole. One example embodiment uses a heat-activated material to cause the reciprocating movement. For example, a heat-activated material, such as paraffin wax, contract upon sensing the heat of the molten solder in the wave, and expands when the wave subsides or a cooling effect is applied to the heat-activated material (or vice-versa).

Another example embodiment uses an electro-mechanical apparatus to cause a similar reciprocating movement of the pin. For example, a pair of electromagnets attract when a current is applied, and separate when the current is not applied or reversed. The timing of the current can be synchronized with the timing of the wave using any suitable technique within the scope of the illustrative embodiments.

Another example embodiment uses an electrical, mechanical, or electro-mechanical apparatus to cause a similar reciprocating movement of the pin. For example, a motor, e.g., a stepper motor, can be configured to turn a screw for a period or distance when a current is applied, causing an implement coupled to an end of the screw to move in the desired direction of the pin's reciprocating movement. The screw turns in the opposite direction when the current is not applied or reversed. The timing of the screw operation can be synchronized with the timing of the wave using any suitable technique within the scope of the illustrative embodiments.

In some embodiments, an apparatus to cause the reciprocating movement includes different mechanisms to cause the reciprocating movements. For example, one pin on a PCBA may be caused to move in the reciprocating movement using a heat-activated material or one type of apparatus, and another pin on the same PCBA may be caused to move in the reciprocating movement using an electro-mechanical device or another type of apparatus.

Furthermore, an apparatus to cause the reciprocating movement may include different mechanisms to cause movements in different directions. For example, while a lifting apparatus using heat, current, or mechanical force may cause the movement away from the solder material, a release mechanism or a disconnecting mechanism may cause the pin to become free from a force applied by, or disengage from, the lifting apparatus and move back in the other direction—towards the solder material. For example, the move away from the solder material may be controlled by the lifting apparatus (lifter), while the move towards the solder material may be free fall under gravity or a controlled descend under the control of a release mechanism (release). Various release mechanisms can be fashioned using this disclosure, such as in a manner similar to but opposite of the lifting mechanisms described herein, and the same are contemplated within the scope of the illustrative embodiments.

These example manners of causing the reciprocating movement of the pin are not intended to be limiting on the illustrative embodiments. From this disclosure, those of ordinary skill in the art will be able to conceive other manners of causing the reciprocating movements, and the same are contemplated within the scope of the illustrative embodiments.

Regardless of how caused, the apparatus to cause the reciprocating movement is mechanically coupled with the pin that is to be moved in the reciprocating movement. For example, in one example embodiment, the apparatus to cause the reciprocating movement is coupled with or attached to the device whose pin is to be moved in the reciprocating movement. Such an example configuration causes the entire device, including one or more pins attached to the device, to move in one or both of the directions of the reciprocating movement.

In another example embodiment, the apparatus to cause the reciprocating movement is coupled with or attached to the PCB, with another apparatus maintaining the devices of the PCBA stationary, causing a relative movement between the PCB and the devices. Such an example configuration causes the relative movement of the PCB to occur in one or both of the directions of the reciprocating movement, causing the hole to move relative to a stationary pin, with a similar result.

Generally, an apparatus to cause the reciprocating movement according to an embodiment, such as a lifter, a release, or a combination thereof, can be coupled with a pin of a device, multiple pins of a device, a device, multiple devices, a portion of a PCB, the entire PCB, or some combination thereof.

The illustrative embodiments are described with respect to certain PCBs, devices, pins, holes, movements, directions, sides of PCBs, materials, temperatures, states of materials, frequencies, distances, periods, thresholds, apparatus and their principles of operations, couplings, logic, rules, policies, algorithms, data processing systems, environments, components, and applications only as examples. Any specific manifestations of such artifacts are not intended to be limiting to the invention. Any suitable manifestation of data processing systems, environments, components, and applications can be selected within the scope of the illustrative embodiments.

Furthermore, the illustrative embodiments may be implemented with respect to any type of data, data source, or access to a data source over a data network. Any type of data storage device may provide the data to an embodiment of the invention, either locally at a data processing system or over a data network, within the scope of the invention.

The illustrative embodiments are described using specific code, designs, architectures, protocols, layouts, schematics, and tools only as examples and are not limiting to the illustrative embodiments. Furthermore, the illustrative embodiments are described in some instances using particular software, tools, and data processing environments only as an example for the clarity of the description. The illustrative embodiments may be used in conjunction with other comparable or similarly purposed structures, systems, applications, or architectures. An illustrative embodiment may be implemented in hardware, software, or a combination thereof.

The examples in this disclosure are used only for the clarity of the description and are not limiting to the illustrative embodiments. Additional data, operations, actions, tasks, activities, and manipulations will be conceivable from this disclosure and the same are contemplated within the scope of the illustrative embodiments.

Any advantages listed herein are only examples and are not intended to be limiting to the illustrative embodiments. Additional or different advantages may be realized by specific illustrative embodiments. Furthermore, a particular illustrative embodiment may have some, all, or none of the advantages listed above.

With reference to FIG. 1, this figure depicts a block diagram of a configuration where increasing solder hole-fill in a printed circuit board assembly can be accomplished in accordance with an illustrative embodiment. PCB 102 comprises one or more holes 104. One or more pins 106 of device 108 occupy the one or more holes 104. An instance of hole 104 need not necessarily be occupied by any pin, but when occupied, is occupied by one instance of pin 106.

Only for the purposes of the clarity of the description and without implying any limitation thereto, assume that wave soldering method is used to solder pins 106 in holes 104. Solder wave 110 comprises molten solder material. Wave 110 rises as depicted to flow the molten solder material into some holes in PCB 102. For example, the example depiction of FIG. 1 shows wave 110 causing the solder material to reach holes 104 but not hole 112.

As recognized by the illustrative embodiments, various factors cause the solder material, such as the solder material in wave 110, to not reach a height threshold in holes 104. An embodiment described herein can be used to cause the solder material, e.g., the solder material in wave 110 to reach higher or farther into the holes 104 than depicted in FIG. 1.

Figure 2:
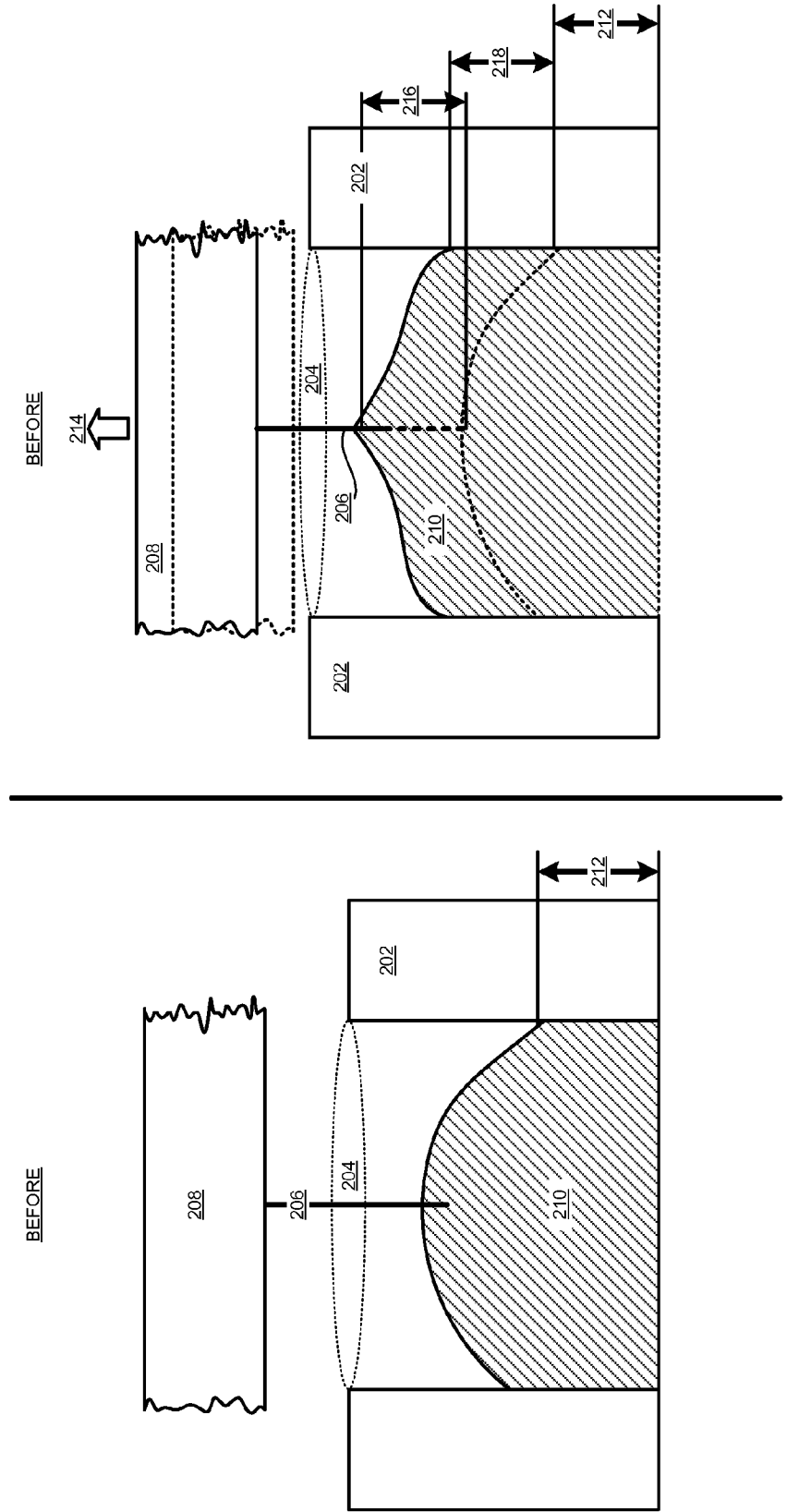
FIG. 2 depicts a block diagram of a data processing system in which illustrative embodiments may be implemented.

With reference to FIG. 2, this figure depicts a block diagram of a configuration for increasing solder hole-fill in a printed circuit board assembly in accordance with an illustrative embodiment. PCB 202 is an example portion of PCB 102 in FIG. 1. Hole 204 is an example of hole 104 in FIG. 1. Pin 206 is an example of pin 106 in FIG. 1. Device 208 is an example portion of device 108 in FIG. 1.

A "Before" view is shown on the left side of the depiction of FIG. 2. The "Before" view shows a hole-fill condition prior to using an embodiment. In the "before" view, solder material 210 rises from example solder wave 110 of FIG. 1 into hole 206. Solder material 210 rises to height 212 as shown. Height 212 is less than a height threshold specified for PCB 202, hole 204, device 208, in a specification, or some combination thereof.

An "After" view is shown on the right side of the depiction of FIG. 2. The "After" view shows a hole-fill increase by using an embodiment. In the "before" view, an embodiment, such as an embodiment using a lifter apparatus described elsewhere in the disclosure, causes device 208 to be moved in direction 214 relative to PCB 202. The movement in direction 214 causes pin 206 to move by distance 216 as one part of the reciprocating movement described elsewhere in the disclosure.

The movement of pin 206 by distance 216 draws solder material 210 farther into hole 204 by additional distance 218. Additional distance 218 is in addition to distance 212 filled in the "Before" view. Solder material 210 upon reaching a total height of distance 212 plus distance 218 in hole 204, meets or exceeds the height threshold.

At a suitable time, while solder material 210 is still in a molten state, an embodiment causes pin 206 to move in a direction opposite to direction 214, such as by changing a direction of operation of the lifter apparatus that was used for movement in direction 214, or by employing a release apparatus. Movement of pin 206 in a direction opposite to direction 214 does not cause solder material 210 to return to height 212. Solder material 210 either remains at distance 212 plus distance 218 in hole 204, or at some distance in addition to distance 212, such that the height threshold remains met or exceeded when pin 206 returns to the position depicted in the "Before" view.

An embodiment can optionally repeat the reciprocating movement of pin 206 in the above described manner any number of times. For example, in some cases, repeated reciprocating movements of pin 206 in the manner described above may be useful to draw solder material 210 farther than distance 212 plus distance 218 into hole 204.

Figure 3:
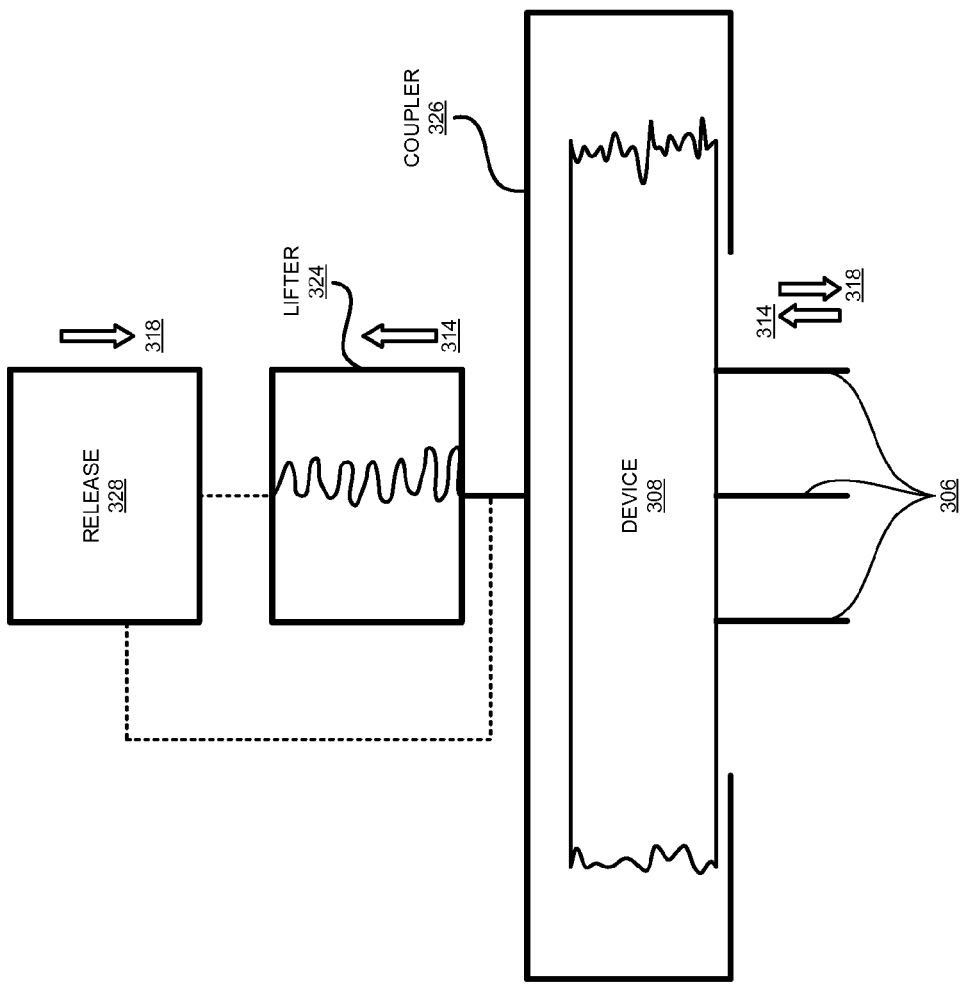
FIG. 3 depicts a block diagram of an example configuration to cause a reciprocating movement for increasing solder hole-fill in a printed circuit board assembly in accordance with an illustrative embodiment.

With reference to FIG. 3, this figure depicts a block diagram of an example configuration to cause a reciprocating movement for increasing solder hole-fill in a printed circuit board assembly in accordance with an illustrative embodiment. Pins 306 of device 308 are examples of pin 206 of device 208, respectively, in FIG. 2. The reciprocating movement of pin 306 comprises movement in direction 314 and 318, alternating between directions 314 and 318.

Lifter 324 comprises an apparatus to cause a movement in direction 314 of pin 306. Lifter 324 can be implemented using any suitable mechanism to cause the movement in direction 314, including, but not limited to the example mechanisms described in this disclosure. Only as an example, lifter 324 is depicted as employing a heat-activated material as such a mechanism.

Only as an example, lifter 324 is coupled with device 308 via coupler 326. Without departing the scope of the illustrative embodiments, coupler 326 can be implemented in any suitable manner to provide a mechanical coupling for transferring a mechanical force from lifter 324 to pin 306 to cause the movement of pin 306 in direction 314. For example, one example implementation (shown) of coupler 326 couples lifter 324 with device 308. Another example implementation (not shown) of coupler 326 couples lifter 324 with one or more pins in pins 306. Another example implementation (not shown) of coupler 326 couples lifter 324 with PCB 202 of FIG. 2 on which device 308 is positioned.

Release apparatus 328 comprises an apparatus to cause a movement in direction 318 of pin 306. Release apparatus 328 can be implemented using any suitable mechanism to cause the movement in direction 318, including, but not limited to the example mechanisms described in this disclosure. Release apparatus 328 can be coupled in any suitable manner with lifter 324, coupler 326, or both.

For example, the coupling between release apparatus 328 and lifter 324, coupler 326, or both, may take the form including, but not limited to, a mechanical mechanism to cause a movement in direction 318, electro-mechanical mechanism to cause a movement in direction 318, a detaching mechanism or other mechanism to cause a movement in direction 318. In one embodiment, release mechanism 328 may be completely absent, causing lifter 324 or coupler 326 to cause the movement in direction 318 upon the solidification of solder material 210 of FIG. 2, passing of solder wave 110 from below holes 104 in FIG. 1, otherwise sensing a change in a temperature in hole 204 in FIG. 2.

With reference to FIG. 4, this figure depicts block diagrams of several example apparatus configurations any of which can be used for increasing solder hole-fill in a printed circuit board assembly in accordance with an illustrative embodiment. Any apparatus depicted in FIG. 4 can be deployed in any suitable orientation, and not just the orientation depicted in FIG. 4. Apparatus 402 is an example of a combination of lifter 324 and release 328 in FIG. 3.

Example apparatus 402 employs a head-activated mechanism that causes contraction 404 in the presence (or absence) of a certain amount of heat and expansion 406 in the absence (or presence) of the same or different amount of heat. Contraction 404 and expansion 406 result in movement of coupler 408, which is an example of coupler 326 in FIG. 3. The movement of coupler 408 according to contraction 404 and expansion 406 causes a pin, e.g., pin 306 in FIG. 3, to move in directions 314 and 318, respectively.

Apparatus 422 is another example of a combination of lifter 324 and release 328 in FIG. 3. Example apparatus 422 employs an electro-mechanical mechanism that causes attraction 424, e.g., magnetic attraction, in the presence (or direction) of a certain amount of electrical current in lead 428. The electro-mechanical mechanism causes separation 426, e.g., non-magnetism or magnetic repulsion, in the absence (or reversed direction) of the same or different current in lead 428. Attraction 424 and separation 426 result in movement of coupler 430, which is an example of coupler 326 in FIG. 3. The movement of coupler 430 according to attraction 424 and separation 426 causes a pin, e.g., pin 306 in FIG. 3, to move in directions 314 and 318, respectively.

In one embodiment, controller 432 is usable to change a direction of the current in lead 428. In another embodiment, controller 432 is usable to adjust a frequency of current reversal, which causes a frequency of reciprocation in the reciprocating movement of the pin coupled to coupler 430. In some circumstances, the operation of controller 432 can be viewed as a release operation for apparatus 422, as described elsewhere in this disclosure.

Apparatus 442 is another example of a combination of lifter 324 and release 328 in FIG. 3. Example apparatus 442 employs an electro-mechanical mechanism that causes travel 444, e.g., travel during screw tightening, in the presence (or direction) of a certain amount of electrical current in lead 448. The electro-mechanical mechanism causes travel 446, e.g., travel during screw loosening, in the absence (or reversed direction) of the same or different current in lead 448. Travel 444 and travel 446 result in movement of coupler 450, which is an example of coupler 326 in FIG. 3. The movement of coupler 450 according to travel 444 and travel 446 causes a pin, e.g., pin 306 in FIG. 3, to move in directions 314 and 318, respectively.

In one embodiment, controller 452 is usable to change a direction of the current in lead 448. In another embodiment, controller 452 is usable to adjust a frequency of current reversal and therefore travel reversal, which causes a frequency of reciprocation in the reciprocating movement of the pin coupled to coupler 450. In some circumstances, the operation of controller 452 can be viewed as a release operation for apparatus 442, as described elsewhere in this disclosure.

In certain circumstances, instructions to cause an operation of a lifter apparatus, a release apparatus, or an apparatus that is a combination of the lifer and release apparatus, can be implemented in software, such as in computer usable program code. Such code can be executed using a general purpose computer, or another data processing system that are well known for their usability in executing computer usable code or instructions for a variety of purposes. For example, the computer usable program code or instruction can be stored in a computer usable storage device and executed by a processor to actuate a coupler or cause a movement as described herein.

Thus, a method, system or apparatus, and computer program product are provided in the illustrative embodiments for dynamic risk assessment based product sampling. While the movements of a pin are described first away from and then towards the solder material, an embodiment can be adapted to first move the pin towards the solder material and then away, such as to increase the adhesion of the solder material to the pin, within the scope of the illustrative embodiments.

The described methods for drawing the solder material into a hole can be used separately or in combination. For example, another method to facilitate the movement of the solder material to attain the threshold distance into the hole according to an embodiment comprises pre-heating a hole, a portion of the PCB or the entire PCB on the side towards which the solder material is to be drawn. For example, if the solder material is applied by a wave on one side (e.g., bottom side) of the PCB, the opposite side (e.g., the top side) of the PCB can be pre-heated to a suitable temperature such that the temperature difference between the temperature of the solder material and the temperature of the conductive lining in the hole is reduced when filling a hole.

Such an embodiment for pre-heating a hole, or all or a portion of a PCB, can be used alone or in conjunction with another method described herein. For example, the pre-heating can be combined with the reciprocating movement of the pin in the hole can be advantageous in certain circumstances, such as to reduce the number of reciprocating movements of the pins, to increase the speed of soldering while achieving the threshold distance of solder material reach into the PCB holes, or for other reasons.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. A method for increasing solder hole-fill in a Printed Circuit Board Assembly (PCBA), the method comprising:
   causing, in the PCBA, a pin of a device to move in a first direction, the PCBA comprising a Printed Circuit Board (PCB) and the device, the pin occupying a hole in the PCB, the hole being filled to a first distance by a solder material;
   drawing, responsive to causing the pin to move, the solder material into the hole up to a second distance, wherein the second distance is greater than the first distance; and allowing the pin to move in a second direction, wherein the move in the second direction returns the pin to an initial position in the hole, and wherein the allowing the pin to move in the second direction keeps the solder material at a third distance, wherein the third distance is greater than the first distance in the hole.

2. The method of claim 1, further comprising:
repeating, the causing, the drawing, and the allowing a number of times at a first frequency, wherein the repeating causes the solder material to reach a threshold distance into the hole.

3. The method of claim 1, further comprising:
using a heat-activated mechanism, the heat activated mechanism causing the move in the first direction responsive to detecting a first temperature, and the heat activated mechanism allowing the move in the second direction responsive to detecting a second temperature.

4. The method of claim 3, wherein the first temperature is a result of the solder material filling the hole in a filling operation, and wherein the second temperature is a result of a cessation of the filling operation.

5. The method of claim 1, further comprising:
using an electro-mechanical mechanism, the electro-mechanical mechanism causing the move in the first direction responsive to a first current flow, and the electro-mechanical mechanism allowing the move in the second direction responsive to a second current flow.

6. The method of claim 3, wherein the second current flow is a cessation of a flow of electrical current.

7. The method of claim 3, wherein the first current flow is a flow of electrical current in a first current flow direction and the second current flow is a flow of the electrical current in a second current flow direction.

8. The method of claim 1, wherein the allowing occurs while the solder material remains in a molten state.

9. The method of claim 1, wherein the third distance is equal to the second distance.

10. The method of claim 1, wherein the third distance at least equals a threshold distance.

11. The method of claim 1, wherein the causing the pin to move is responsive to the first distance being less than a threshold distance.

12. The method of claim 1, wherein the move in the first direction comprises moving the pin away from the solder material.

13. The method of claim 1, further comprising:
heating a portion of the PCB to a first temperature, wherein the first temperature is less than a temperature of the solder material in a molten state, the portion of the PCB occupying a side of the PCB that is opposite a second side of the PCB, the solder material being applied to the PCB on the second side.

14. The method of claim 1, the device comprising a plurality of pins, the plurality of pins including the pin.

15. The method of claim 1, wherein the causing the pin to move in the first direction moves the pin from the initial position of the pin in the hole to a first position of the pin in the hole.

* * * * *